United States Patent
Ma et al.

(10) Patent No.: US 11,899,067 B2
(45) Date of Patent: Feb. 13, 2024

(54) TESTING CIRCUIT, SYSTEM AND CONTROL METHOD FOR MULTIPLE SUBMODULES OF CASCADED CONVERTER

(71) Applicant: SHANGHAI JIAO TONG UNIVERSITY, Shanghai (CN)

(72) Inventors: Ke Ma, Shanghai (CN); Shan Jiang, Shanghai (CN); Enyi Li, Shanghai (CN)

(73) Assignee: SHANGHAI JIAO TONG UNIVERSITY, Shanghai (CN)

( * ) Notice: Subject to any disclaimer, the term of this patent is extended or adjusted under 35 U.S.C. 154(b) by 434 days.

(21) Appl. No.: 17/283,566

(22) PCT Filed: Jul. 23, 2020

(86) PCT No.: PCT/CN2020/103857
§ 371 (c)(1),
(2) Date: Apr. 8, 2021

(87) PCT Pub. No.: WO2021/013229
PCT Pub. Date: Jan. 28, 2021

(65) Prior Publication Data
US 2021/0389376 A1    Dec. 16, 2021

(30) Foreign Application Priority Data

Jul. 23, 2019 (CN) .......................... 201910665459.6
Jul. 23, 2019 (CN) .......................... 201910665460.9
Jul. 23, 2019 (CN) .......................... 201910668891.0

(51) Int. Cl.
*H02M 3/155*  (2006.01)
*H02M 1/00*   (2006.01)
(Continued)

(52) U.S. Cl.
CPC .......... *G01R 31/34* (2013.01); *H02M 1/0009* (2021.05); *H02M 3/155* (2013.01)

(58) Field of Classification Search
CPC .................. H02M 7/483–4835; H02M 1/0009
See application file for complete search history.

(56) References Cited

U.S. PATENT DOCUMENTS

| 11,611,289 B2 * | 3/2023 | Liu ..................... H02M 1/0095 |
| 2020/0076323 A1 * | 3/2020 | Yonemura ............. H02J 3/0012 |

(Continued)

FOREIGN PATENT DOCUMENTS

| CN | 102565579 A | 7/2012 |
| CN | 101707443 B * | 5/2013 |

(Continued)

*Primary Examiner* — Sisay G Tiku
(74) *Attorney, Agent, or Firm* — Bayramoglu Law Offices LLC

(57) ABSTRACT

A testing circuit for multiple SMs of a cascaded converter and a control method thereof are provided. A current generator generates a testing current flowing into a testing module group. The testing module group includes two series-connected testing arms that each contains multiple SMs, or in an alternative way, the testing module group is composed of one or multiple testing units connected in series, and each testing unit includes two testing SMs connected in series reversely. The testing circuit the control method thereof realizes a mission profile emulation of the multiple SMs of the cascaded converter in both inverting and rectifying modes simultaneously to improve a test efficiency. A reverse series connection structure of the two testing SMs offsets a DC component in a capacitor voltage to reduce a power supply voltage required for a test. Dynamic and static control methods under different modulations for the test circuit are provided.

17 Claims, 4 Drawing Sheets

(51) Int. Cl.
*G01R 31/34* (2020.01)
*H02M 7/483* (2007.01)

(56) References Cited

U.S. PATENT DOCUMENTS

| | | | | |
|---|---|---|---|---|
| 2021/0044216 A1* | 2/2021 | Riar | ........................ | B60L 53/22 |
| 2021/0384816 A1* | 12/2021 | Xiao | ........................ | H02M 1/32 |
| 2022/0029524 A1* | 1/2022 | Kajiyama | ................ | H02M 1/12 |
| 2022/0368219 A1* | 11/2022 | Liu | ........................ | H02M 7/217 |
| 2023/0018083 A1* | 1/2023 | Kajiyama | ................ | H02M 1/12 |

FOREIGN PATENT DOCUMENTS

| | | | | | | |
|---|---|---|---|---|---|---|
| CN | 103199682 | A | * | 7/2013 | | |
| CN | 103675539 | A | | 3/2014 | | |
| CN | 103701350 | A | | 4/2014 | | |
| CN | 105337519 | A | * | 2/2016 | ............. | G01R 27/18 |
| CN | 105553314 | A | * | 5/2016 | | |
| CN | 107070289 | A | * | 8/2017 | ............. | H03K 3/57 |
| CN | 107645249 | A | * | 1/2018 | | |
| CN | 107863889 | A | * | 3/2018 | ............. | H02J 3/386 |
| CN | 108539723 | A | * | 9/2018 | ............. | H02H 9/02 |
| CN | 109188156 | A | | 1/2019 | | |
| CN | 109324243 | A | | 2/2019 | | |
| CN | 109709363 | A | * | 5/2019 | | |
| CN | 109709363 | A | | 5/2019 | | |
| CN | 109709434 | A | | 5/2019 | | |
| CN | 110426649 | A | | 11/2019 | | |
| CN | 110488114 | A | | 11/2019 | | |
| CN | 110488115 | A | | 11/2019 | | |
| CN | 110850194 | A | | 2/2020 | | |
| CN | 215297543 | U | * | 12/2021 | | |
| CN | 115128317 | A | * | 9/2022 | | |
| EP | 2667279 | A1 | * | 11/2013 | ............. | H02J 3/1857 |
| WO | 2018179145 | A1 | | 10/2018 | | |

* cited by examiner

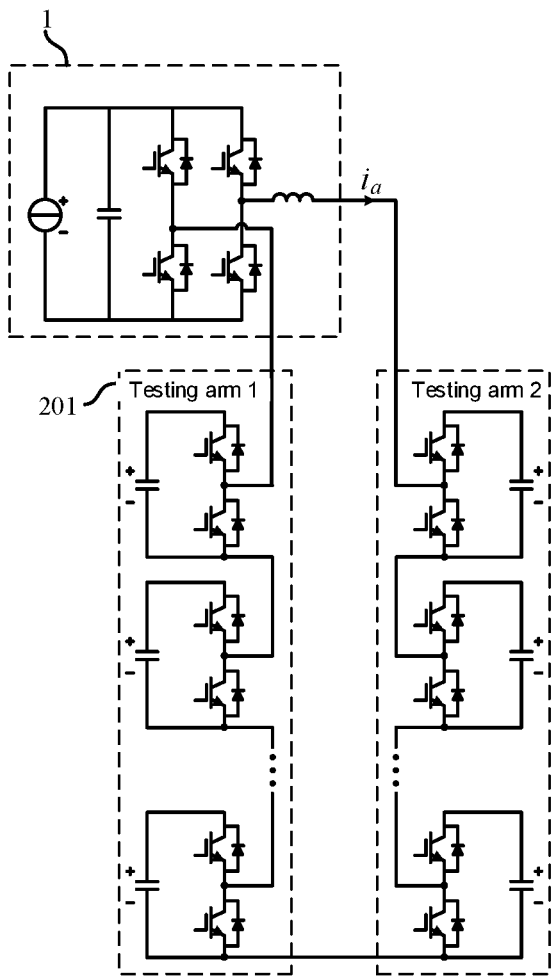
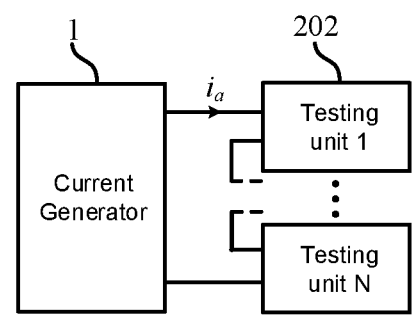
FIG. 1
FIG. 2
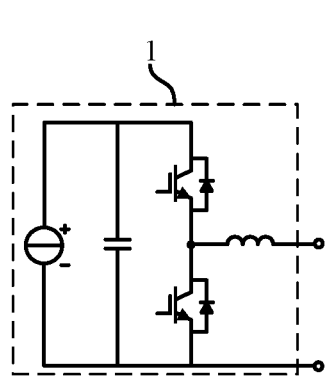
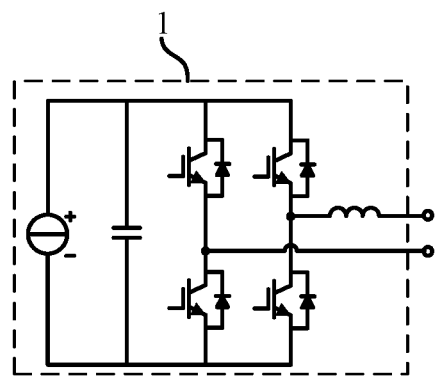
FIG. 3
FIG. 4

US 11,899,067 B2

TESTING CIRCUIT, SYSTEM AND CONTROL METHOD FOR MULTIPLE SUBMODULES OF CASCADED CONVERTER

CROSS REFERENCE TO THE RELATED APPLICATIONS

This application is the national stage entry of International Application No. PCT/CN2020/103857, filed on Jul. 23, 2020, which is based upon and claims priority to Chinese Patent Application No. 201910665459.6, filed on Jul. 23, 2019, and Chinese Patent Application No. 201910668891.0, filed on Jul. 23, 2019 the entire contents of which are incorporated herein by reference.

TECHNICAL FIELD

The present invention relates to the technical field of power electronics, and in particular to the testing circuit, system and control method for multiple submodules (SMs) of a cascaded converter.

BACKGROUND

Cascaded converters, e.g. Cascaded H-Bridge (CHB) and Modular Multilevel Converter (MMC), are composed of cascaded SMs, and its advantageous structure makes it easy to expand, and it is especially promising to be applied in high-voltage, large-capacity operating scenarios. With the continuous improvement of the capacity and voltage level of cascaded converters, the evaluation and testing of the reliability of cascaded converters during the normal operation have received more and more attention. In the early stage, in order to evaluate and test the reliability of cascaded converters, it is often necessary to build a complete cascaded converter system. However, considering that the reliability of cascaded converters mainly depends on the reliability of the SMs, therefore, it has become a more effective and cost-efficient method to evaluate the reliability of the cascaded system by using the mission profile emulator for SMs. Since the operating conditions of the SM are closely related to the converter, in order to ensure the long-term reliable operation of the converter, it is of great significance to test the SMs in operating conditions that are close to the actual system.

However, the existing test platforms can only provide limited testing conditions and control modes, of which the power supply requirements are high and the test efficiency is low. Due to the limitation of the DC supply voltage, the existing testing platforms are not capable of testing multiple SMs simultaneously. Therefore, a simple and reliable testing circuit is needed to accurately emulate the operating conditions of the tested SM in the actual system, and multiple SMs under different operating conditions can be simultaneously tested with reduced DC supply voltage and enhanced testing efficiency.

In addition, the nearest level control (NLC) is the commonly adopted modulation method in cascaded converters. With this modulation method, the pulse voltage output of the SM of the cascaded converter has the characteristics of large pulse amplitude and wide pulse width. The SM may hold on-state or off-state for a long time, which makes the pulse voltage of the tested SM has a great interference to the current controller and makes it difficult for the current controller to regulate the current stably.

For example, the Chinese inventions with invention numbers ZL201910083488.1 and ZL201910083490.9 can emulate the operating conditions of SMs in the cascaded converter with certain freedom, but the SMs operating in different operating conditions are coupled with each other in the testing circuit, which increases the control difficulty, and at the same time cannot suppress the voltage pulse interference caused by the NLC modulation. That is to say, in the traditional testing platforms that realizes the mission profile emulation of SMs in the cascaded converter, there is no effective method to suppress the voltage pulse interference caused by the NLC modulation. In order to eliminate the influence of the output pulse voltage of the SM, the common approach is to add additional auxiliary circuits, which are controlled to operate in coordination with the tested SMs, so as to remove the interference of the SM pulse voltage on the current controller. However, the additional circuit increases the complexity of the control and the manufacturing cost of the testing circuit. What's more, the control delay caused by the dead time in switching transients will hinder the synchronization of the auxiliary circuit and the pulse voltage, and the auxiliary circuit cannot function well to eliminate the interference of pulse voltage. Therefore, there is an urgent need of a simpler and more cost-effective mission profile emulation technology for SMs in the cascaded converter and the corresponding current control method thereof.

SUMMARY

Given the flaws of existing techniques, the purpose of the present invention is to provide a testing circuit for multiple SMs of the cascaded converter and the control method thereof.

In the first aspect of the present invention, a testing circuit for multiple SMs of the cascaded converter is proposed, which comprises: a current generator and a testing module group, the current generator provides the testing current to the testing module group; wherein the testing module group adopts any of the following forms:

The testing module group includes two testing arms, each testing arm includes a number of tested SMs connected in series, and the two testing arms are in a reverse series connection structure; The tested SMs in two testing arms map to the rectifying and inverting operating conditions of the cascaded converter respectively; the two testing arms have the identical or different structures;

The testing module group includes one or more testing units, and the testing units are connected in series; each testing unit includes two tested SMs connected in series reversely, which map to the rectifying and inverting operating conditions of the cascaded converter respectively; the DC voltage components in the capacitor voltages of the two reversely connected SMs have opposite directions and are equal in magnitude;

The testing module group and its internal tested SMs can be arranged in any order in the testing circuit provided when the electrical connection relationship remain unchanged; when the testing module group receives the testing current generated by the current generator, the testing module group emulates the voltage signal of SMs in the cascaded converter, or emulates the voltage and current signal of SMs in the cascaded converter.

Optionally, the current generator comprises: a single-phase converter and a filter; wherein:

When the testing module group includes two testing arms with the same structure, the first end of the single-phase converter is connected to the input end of the filter, and the output end of the filter is connected to the input end of the testing arm 2. The second end of the single-phase converter is connected to the input end of the testing arm 1 in series, and the output ends of two testing arms are mutually connected; the series sequence of the single-phase converter, filter, and two testing arms can be changed with certain freedom;

When the testing module group includes one or more testing units, the first end of the single-phase converter is connected to the input end of the filter, and the output end of the filter is connected to the first input end of testing units in series connection. The second end of the single-phase converter is connected to the second input end of testing units in series connection; the series sequence of the single-phase converter, filter, and testing units can be changed with certain freedom.

Optionally, each tested SM comprises: a bridge circuit and a capacitor, and the bridge circuit and the capacitor are connected in parallel.

Optionally, the bridge circuit can be either a half-bridge circuit or a full-bridge circuit; the filter can be any one kind of L filter, CL filter, LC filter, LCL filter.

Optionally, the tested SMs correspond to SMs in the actual cascaded converter, and the testing current regulated by the current generator corresponds to the arm or phase current that flows through tested SMs in the actual cascaded converter; the testing current refers to: the upper and lower arm current of each phase of the cascaded converter, or the output current of each phase.

In the second aspect of the present invention, a testing system for SMs of the cascaded converter is proposed, which is characterized by comprising: a current generator, a testing module group, a cascaded converter system parameter model, a current controller, and a voltage controller;

The current generator is used to provide the testing current, with the specific waveform, to the testing module group;

The testing module group comprises one or more testing arms, each of which contains one or more tested SMs connected in series, and the testing arms are in reverse series connection structure; Or, the testing module group includes one or more tested units, and each testing unit includes two tested SMs in reverse series, and all the tested units are in series relationship; When the testing module group receives the testing current regulated by the current generator, the testing module group outputs the voltage signals of the tested SMs;

The cascaded converter system parameter model is used to output reference current and voltage signals, corresponding to system parameters and operating conditions of the actual cascaded converter, to the current controller and voltage controller;

A current controller is used to control the testing current generated by the current generator and to generate the control signals required by the current generator;

A voltage controller is used to control the capacitor voltage of the tested SMs in the testing module group, and to generate switching signals of the tested SMs in the testing module group.

Optionally, the current controller specifically realizes one or two of the following controls:

According to the test current signal and the reference current signal output by the cascaded converter system parameter model, the control signal of the current generator is generated, and the testing current output by the current generator is adjusted by the control signal, so that the current output by the generator is the same as the reference current signal output by the cascaded converter system parameter model;

Collect the output testing current $i_a$ of the single-phase current generator and the reference current $i_{a,ref}$ output by the cascade converter system parameter model, calculate the current difference between the output test current $i_a$ and the reference current $i_{a,ref}$, and transfer the current difference to the proportional-integral-resonant controller to generate the reference output voltage $u_a$ of the current generator, which will be used to generate the control signals of semiconductors in the current generator with pulse-width modulation.

Optionally, the voltage controller, based on the capacitor voltage signals of the tested SMs output by the testing module group and the reference voltage signal output by the system parameter model of the cascaded converter, generates the control signals of all switching devices in each tested SM, so that the capacitor voltage of each tested SM within the testing module group remains balanced, and the capacitor voltage of the tested SM is the same as the capacitor voltage of the targeted SM in the actual cascaded converter.

Optionally, the voltage controller comprises: a capacitor voltage balancing module and a switching signal modulation module; wherein:

The capacitor voltage balancing module generates the target voltage signals of the tested SMs based on the testing current output by the current generator, the capacitor voltage of each tested SM inside the test module group, and the reference voltage output by the cascaded converter system parameter model; wherein the reference voltage signal includes the average capacitor voltage and the SM reference voltage;

The switching signal modulation module determines the number of tested SMs to be inserted according to the target voltage signal generated by the capacitor voltage balancing module, and controls the switching status of each tested SM according to the testing current output by the current generator.

Optionally, the capacitor voltage balancing module includes an averaging element, a sign judgment element, an adder, a multiplier, and a PI controller, wherein the averaging element is connected to the sign judging element through the output terminal of the adder, and is connected in series with the PI controller after passing through the multiplier;

The capacitor voltage balancing module performs closed-loop control on the capacitor voltages of the tested SMs in the testing module group, and the closed-loop control strategy is as follows:

The average values $V_{avg1}$ and $V_{avg2}$ of the capacitor voltages of the tested SMs in the testing arm are respectively compared with the reference capacitor voltage signals $V_{ref1}$ and $V_{ref2}$ output by the cascaded converter system parameter model to obtain the capacitor voltage difference;

The capacitor voltage difference is multiplied by the polarity of the testing current signal output by the current generator, and then superimposed with the reference voltage signals $u_{ref1}$ and $u_{ref2}$ output by the cascaded converter system parameter model after passing through the proportional-integral controller, as the input signal of the switching signal modulation module; the output signal of the capacitor voltage balancing module determines the number of inserted SMs in the next switching cycle;

The switching signal modulation module adopts a voltage modulation method to determine the gating signal of each tested SM in the testing module group based on the preset carrier waveform and the target voltage signal generated by the capacitor voltage balancing module, or determine the gating signal of the tested SM according to the sorting sequence of capacitor voltages and the direction of the testing current, so that the capacitor voltages of the tested SMs in the testing module group are the same as those in the actual cascaded converter.

In the third aspect of the present invention, a current control method for a cascaded converter SM testing system is proposed, which is characterized in that the following control method is used to suppress the interference of the pulse voltage of the tested SM caused by the NLC modulation on the current output waveform; Specifically, by compensating the feedforward voltage in the current controller, the interference of the pulse voltage of the tested SM caused by the NLC modulation is eliminated; wherein:

The feedforward voltage used for compensation is generated by any of the following methods:

Method 1: Calculate the difference between the inserted number of the tested SMs in the inverting mode and the tested SMs in the rectifying mode, and generate the feedforward voltage in combination with the capacitor voltage of a single SM;

Method 2: First, sample the terminal pulse voltage signal of the tested SM through a voltage sampler; then perform low-pass filtering on the sampled voltage signal to remove the sampling error caused by the switch dead zone; finally, the filtered voltage signal is used as the feedforward voltage;

The feedforward voltage that changes synchronously with the pulse voltage at the terminal of the testing module is compensated to the output of the PIR regulator in the current controller, so as to eliminate the interference caused by the pulse voltage at the terminal of the tested SM and remove the current distortion caused by the interference of the pulse voltage.

Optionally, this method is suitable for realizing the current control of a cascaded converter SM testing system under the NLC modulation; or, applied to realize the current control of the cascaded converter SM testing system under carrier phase shifted (CPS) modulation.

In the fourth aspect of the present invention, a testing method suitable for SMs in the cascaded converter under the NLC modulation is proposed. This method is based on the testing circuit for multiple SMs in the cascaded converter or the testing system for SMs in the cascaded converter, by using the current control method, to carry out the test for SMs of the cascaded converter.

Compared with existing techniques, the present invention has the following beneficial effects:

1. In the testing circuit for multiple SMs of the cascaded converter provided by the present invention, the first configuration of testing module group presents symmetrical arm structure, and each testing arm contains multiple tested SMs connected in series. This structure can realize the mission profile emulation of multiple SMs of the cascaded converter in both inverting and rectifying modes simultaneously, which allows series-connected tested SMs to be easily expanded, significantly improves the testing efficiency and reduces testing costs. Furthermore, in this testing circuit for multiple SMs of the cascaded converter based on a symmetrical arm structure, the two testing arms contain the same number of tested SMs, and two testing arms are connected in reverse series. The structure ensures that the DC voltage components in the capacitor voltage of tested SMs inside two testing arms counterbalance with each other, which significantly reduces the requirements for the DC supply voltage in the testing circuit. In addition, this circuit can flexibly arrange the number of SMs under test and set up the operating conditions by changing the output current of the current generator, which improves the flexibility of the experiment.

2. In the testing circuit for multiple SMs of the cascaded converter provided by the present invention, the second structure of the testing module group is a reverse series connection structure. Each testing unit includes two reversely series-connected SMs that can realize the mission profile emulation of the same SM in the cascaded converter that operates in both inverting and rectifying modes. In addition, several series-connected testing units can realize the testing of multiple SMs, and the series-connected testing unit is easy to expand, which significantly improves testing efficiency and reduces testing costs. Furthermore, in this testing circuit for multiple SMs of the cascaded converter based on a reverse series connection structure, the basic structure of reverse series connection of two tested SMs in the same testing unit allow their DC voltage components in the capacitor voltages to counterbalance with each other, which significantly reduces the requirements for the DC supply voltage in the testing circuit. In addition, this circuit can flexibly arrange the number of SMs under test and set up the operating conditions by changing the output current of the current generator, which improves the flexibility of the experiment.

3. The control system for the testing circuit for multiple SMs of the cascaded converter provided by the present invention can generate the testing current flowing into the tested SMs that is the same as the actual operating condition, on the basis of the current generator and the current controller; The voltage controller regulates the capacitor voltages and switching states of tested SMs to be close to the actual operating condition, in order to realize the mission profile emulation of multiple SMs of the cascaded converter in both inverting and rectifying modes simultaneously, which significantly improves the testing efficiency and accuracy; The control system can flexibly arrange the number of SMs under test and set up the operating conditions by changing the output current of the current generator, which improves the flexibility of the experiment.

4. The current control method for the testing system for SMs of the cascaded converter provided by the present invention generates the feedforward voltage through calculation or sampling, and compensates the feedforward voltage by using the current controller. As the generated feedforward voltage changes synchronously with the switching states of the tested SM, this method performs better in eliminating the interference of pulse terminal voltage of the testing module group that adopts NLC modulation, and further removes the current distortion caused by the pulse voltage. This method does not rely on additional auxiliary circuits. Thereby it reduces the complexity of control system, saves the manufacturing cost of the testing system, and is a valuable technical improvement.

BRIEF DESCRIPTION OF THE DRAWINGS

FIG. 1 illustrates the configuration of the testing circuit for multiple SMs of the cascaded converter with the testing module group arranged in the symmetrical arm structure according to an embodiment of the present invention;

FIG. 2 illustrates the configuration of the testing circuit for multiple SMs of the cascaded converter with the testing module group arranged in the reverse series connection structure according to an embodiment of the present invention;

FIG. 3 is a schematic diagram of the first topology structure of the current generator in the testing circuit for multiple SMs of the cascaded converter according to an embodiment of the present invention;

FIG. 4 is a schematic diagram of the second topology structure of the current generator in the testing circuit for multiple SMs of the cascaded converter according to an embodiment of the present invention;

Figures 5, 6, 7, 8:
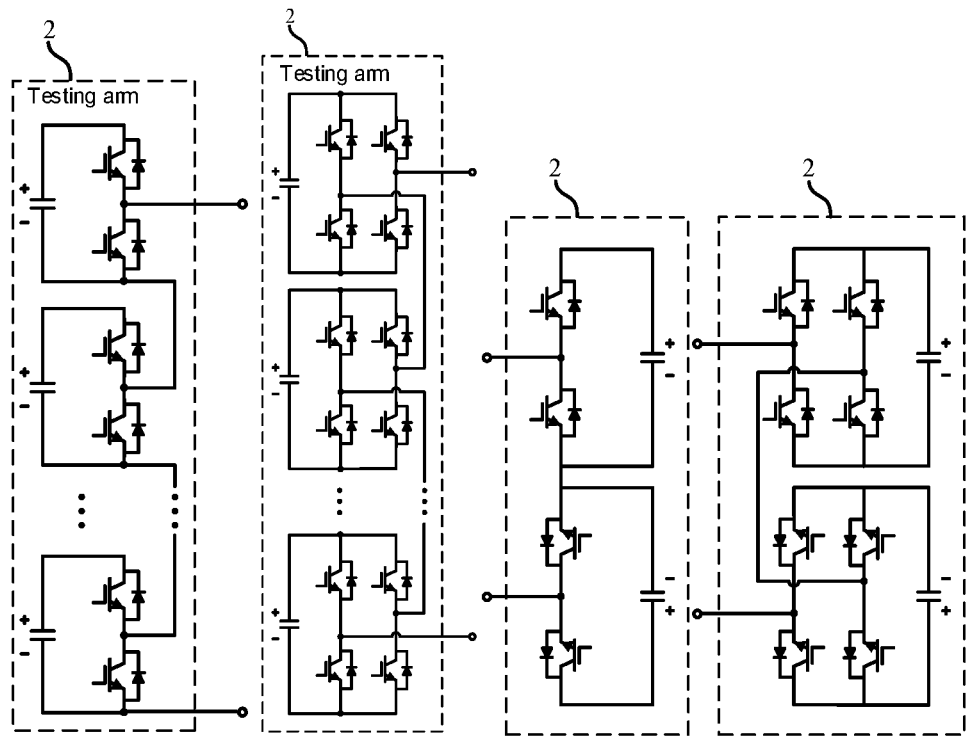
FIG. 5 is a schematic diagram of the first topology structure of the testing arm in the testing circuit for multiple SMs of the cascaded converter with the first structure according to an embodiment of the present invention.
FIG. 6 is a schematic diagram of the second topology structure of the testing arm in the testing circuit for multiple SMs of the cascaded converter with the first structure according to an embodiment of the present invention.
FIG. 7 is a schematic diagram of the first topology structure of the testing unit in the testing circuit for multiple SMs of the cascaded converter with the testing module group arranged in the reverse series connection structure according to an embodiment of the present invention.
FIG. 8 is a schematic diagram of the second topology structure of the testing unit in the testing circuit for multiple SMs of the cascaded converter with the testing module group arranged in the reverse series connection structure according to an embodiment of the present invention.

In figures: current generator 1, testing module group 2, testing arm 201, testing unit 202, cascaded converter system parameter model 3, current controller 4, voltage controller 5, capacitor voltage balancing module 51, switching signal modulation module 52, terminal voltage sampler 6, low pass filter 7.

DETAILED DESCRIPTION OF THE EMBODIMENTS

The present invention will be described in detail below in conjunction with specific embodiments. The following examples will help technicians in the art to further understand the present invention, but do not limit the present invention in any form. It should be noted that for common technicians in the art, several changes and improvements can be made without departing from the concept of the present invention. These all belong to the protection scope of the present invention.

Referring to FIGS. 1 and 3-6, the testing circuit for multiple SMs in the cascaded converter with a symmetrical arm structure is provided by the present invention. The cascaded converters that can be emulated include but are not limited to half-bridge or full-bridge circuit based modular multilevel converter (MMC) and cascaded H-bridge converter (CHB).

Specifically, FIG. 1 is a schematic structural diagram of a single-phase testing circuit for SMs in the cascaded converter based on a symmetrical arm structure according to an embodiment of the present invention; as shown in FIG. 1, it includes: a current generator 1 and a testing module group. The testing module group includes two testing arms 201. The current generator 1 provides testing current to the two testing arms 201. The structure of the two testing arms 201 can be the same or different; two testing arms 201 are connected in reverse series. Each testing arm 201 includes N tested SMs connected in series; when the testing arm 201 receives the testing current sent by the current generator 1, the testing arm 201 tests the voltage signal of the tested SMs, or test the voltage signal and current signal of the tested SMs. The testing arm 201 and its internal tested SMs can be arranged in any order in the testing circuit without changing the electrical connection relationship; in two reversely series-connected testing arms 201, the DC voltage components of the capacitor voltages of tested submodules are in opposite directions and can cancel each other. In a preferred mode, when the testing module group includes two testing arms with the same structure, the number of tested SMs in the two testing arms is the same, and the DC voltage components of all tested SMs are the same.

Preferably, the current generator 1 is used to generate the testing current, and is mainly composed of a single-phase converter and its corresponding terminal filter; wherein the upper end of the single-phase converter is connected to the input end of the terminal filter. Further, the upper end of the current generator 1 is connected to the input end of the second testing arm 201, and the lower end is connected to the input end of the first testing arm 201 for generating the testing current that flows through the tested SMs inside two testing arms 201; the input ends of the two testing arms 201 are respectively connected to the current generator 1 to receive the testing current, and output the capacitor voltage signal of the internal tested SMs to the external; based on the testing current generated by the current generator 1, the mission profile emulation of multiple SMs of the cascaded converter in both inverting and rectifying modes is realized in two testing arms 201, which significantly reduces the requirement of DC supply voltage and improves the testing efficiency.

Preferably, in the above-mentioned embodiment, the current generator 1 has at least one set of two output ports, and the output current $i_a$ corresponds to the current of the arm where the tested submodule of the actual cascade converter is located. The single-phase converter can adopt any two-level and multi-level circuit topologies including but not limited to, specifically, the half-bridge converter as shown in FIG. 3, and the full-bridge converter as shown in FIG. 4; The terminal filter can use any filter including but not limited to L, LC, LCL type filters; the tested SM in the testing arm 201 can correspond to SMs in either the upper or lower arm of each phase of the actual converter. The topology of the testing arm 201 includes, but is not limited to, the structures composed of SMs with the half-bridge circuit or the full-bridge circuit as shown in FIG. 5 and FIG. 6. The circuit topology in FIG. 5 contains: multiple half-bridge converters connected in series in the same direction and their parallel capacitors. The circuit topology in FIG. 5 contains: multiple full-bridge converters connected in series in the same direction and their parallel capacitors.

The single-phase testing circuit for multiple SMs of the cascaded converter with the testing module group arranged in the symmetrical arm structure proposed in the above embodiment of the present invention can realize the mission profile emulation of the any SM of the cascaded converter in any operating condition and realize the test of multiple SMs under a variety of operating conditions simultaneously, which effectively reduces the DC supply voltage requirement, saves the testing costs and improves the testing efficiency.

Referring to FIGS. 2-4 and FIGS. 6-7, the testing circuit for multiple SMs in the cascaded converter with a reverse series connection structure is provided by the present invention. The cascaded converters that can be emulated include but are not limited to half-bridge or full-bridge circuit based modular multilevel converter (MMC) and cascaded H-bridge converter (CHB).

Specifically, FIG. 2 is a schematic structural diagram of a single-phase testing circuit for SMs in the cascaded converter based on a reverse series connection structure according to an embodiment of the present invention; as shown in FIG. 2, it includes: a current generator 1 and a testing module group. The current generator 1 provides testing current to the testing module group. Among them, the testing module group includes one or more testing units 202, each testing unit 202 includes two tested SMs connected in reverse series; the testing units 202 are connected in series; the DC voltage components of the capacitor voltage of two tested SMs connected in reverse series are opposite in direction and equal in magnitude; the testing module group and its internal tested SMs can be arranged in any order in the testing circuit without changing the electrical connection relationship. When the testing unit 202 receives the testing current sent by the current generator 1, the testing unit 202 tests the voltage signal of the tested SMs, or tests the voltage signal and current signal of the tested SMs. Two tested SMs connected in reverse series in each testing unit 202 respectively operates in various operating conditions such as the inverting mode and the rectifying mode; The DC voltage components of capacitor voltage of two tested SMs connected in reverse series are in opposite directions and can cancel each other out.

Specifically, referring to FIG. 2, the testing units 202 are connected in series. Among them, the current generator 1 is used to generate the testing current, which is mainly composed of a single-phase converter and its corresponding terminal filter; the upper end of the single-phase converter is connected to the input end of the terminal filter. The output end of the current generator 1 is connected to a number of testing units 202 connected in series, and is used to generate the testing current flowing through the tested SMs inside testing units 202; the input end of testing units 202 is connected to the current generator 1, which is used to receive the test current and output the capacitor voltage signals of the tested SMs inside testing units 202 to the external; based on the testing current generated by the current generator 1, the mission profile emulation of multiple SMs of the cascaded converter in multiple operating conditions is realized in the testing units 202, which significantly reduces the requirement of DC supply voltage and improves the testing efficiency.

Preferably, in the above-mentioned embodiment, the current generator 1 has at least one set of two output ports, and the output current $i_a$ corresponds to the current of the arm where the tested submodule of the actual cascade converter is located. The single-phase converter can adopt any two-level and multi-level circuit topologies including but not limited to, specifically, the half-bridge converter as shown in FIG. 3, and the full-bridge converter as shown in FIG. 4; The terminal filter can use any filter including but not limited to L, LC, LCL type filters; the tested SM in the testing unit 202 can correspond to SMs in either the upper or lower arm of each phase of the actual converter. The topology of the testing unit includes, but is not limited to, the structures composed of SMs with the half-bridge circuit or the full-bridge circuit as shown in FIG. 7 and FIG. 8. The circuit topology in FIG. 7 contains: two half-bridge converters connected in reverse series and their parallel capacitors. The circuit topology in FIG. 8 contains: two full-bridge converters connected in reverse series and their parallel capacitors.

The single-phase testing circuit for multiple SMs of the cascaded converter with the testing module group arranged in the reverse series connection structure proposed in the above embodiment of the present invention can realize the mission profile emulation of the any SM of the cascaded converter in any operating condition and realize the test of multiple SMs under a variety of operating conditions simultaneously, which effectively reduces the DC supply voltage requirement, saves the testing costs and improves the testing efficiency.

Figure 9:
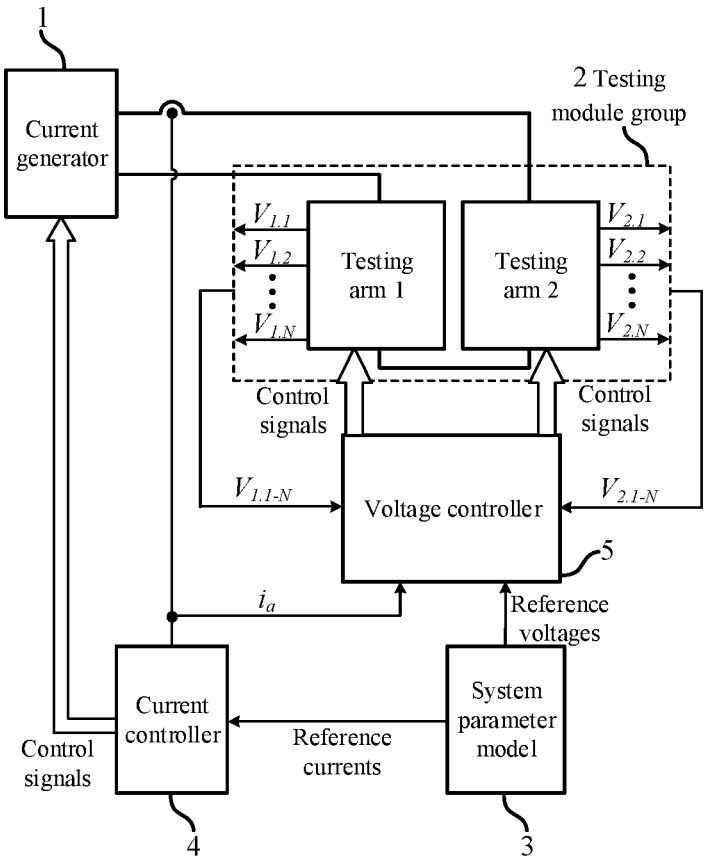
FIG. 9 is a schematic diagram of the testing system for SMs of the cascaded converter according to an embodiment of the present invention.

FIG. 9 is a schematic diagram of the testing system for SMs in the cascaded converter provided in another embodiment of the present invention. The cascaded converters that can be emulated by the testing system include but are not limited to half-bridge or full-bridge circuit based modular multilevel converter (MMC) and cascaded H-bridge converter (CHB).

As shown in FIG. 9, the testing system for SMs in the cascaded converter in this embodiment includes: a current generator 1, a testing module group 2, a cascaded converter system parameter model 3, a current controller 4, and a voltage controller 5. The current generator 1 is used to provide the testing current, with the specific waveform, to the testing module group 2; The testing module group 2 comprises one or more testing arms, each of which contains one or more tested SMs connected in series, and the testing arms are in reverse series connection structure; Or, the testing module group 2 includes one or more tested units, and each testing unit includes two tested SMs in reverse series, and all the tested units are in series relationship; When the testing module group 2 receives the testing current regulated by the current generator, the testing module group 2 outputs the voltage signals of the tested SMs; The cascaded converter system parameter model 3 is used to output reference current and voltage signals, corresponding to system parameters and operating conditions of the actual cascaded converter, to the current controller 4 and voltage controller 5; A current controller 4 is used to control the testing current generated by the current generator and to generate the control signals required by the current generator 1; A voltage controller 5 is used to control the capacitor voltage of the tested SMs in the testing module group 2, and to generate switching signals of the tested SMs in the testing module group 2.

In the above embodiments, the current generator 1 and the testing module group 2 constitute the testing circuit for multiple SMs in the cascaded converter in the embodiment as shown in FIGS. 1 and 2; the cascaded converter system parameter model 3, the current controller 4 and the voltage controller 5 constitute a control system for the testing circuit for multiple SMs in the cascaded converter, thereby forming a complete testing system for SMs in the cascaded converter.

Specifically, as shown in FIG. 9, in the testing system for SMs in the cascaded converter given in the above embodiment, the output end of the current generator 1 is connected to the upper end of the testing module group 2 for generating the testing current that flows through internal tested SMs in the testing module group 2. In the testing module group 2, the input end is connected with the current generator 1 to receive the testing current, and output the capacitor voltage signals of internal tested SMs to the voltage controller 5. The cascaded converter system parameter model 3 generates reference current and voltage signals according to the system parameters and operating conditions of the actual cascaded converter for emulating actual operating conditions, and outputs the reference current and voltage signals to the current control 4 and the voltage controller 5, serving as the corresponding target current signal and target voltage signal. The current controller 4 receives the reference current signal output by the cascade converter system parameter model 3, and controls the switching pulse of each device in the current generator to make the output current of the current generator 1 approximately the same as the reference current given by the cascade converter system parameter model 3. The voltage controller 5 collects the current signal of the current generator 1, the capacitor voltage signal of each tested SM output by the testing module group 2, and the average capacitor voltage and SM reference voltage (reference voltage signal) output by the cascaded converter system parameter model 3, and then generates the control signal of each tested SM in the testing module group 2. The capacitor voltage of each tested SM in the testing module group 2 is approximately the same as that of the target SM in the actual cascaded converter.

In the above-mentioned embodiment, the output end of the current generator 1 is connected to the testing module group 2 for generating the testing current, which includes a single-phase converter and its corresponding filter. The specific structure of the testing module group 2 is the same as in the embodiment shown in FIGS. 1-8.

Preferably, in the above-mentioned embodiment, the voltage controller 5 comprises a capacitor voltage balancing module 51 and a switching signal modulation module 52; the capacitor voltage balancing module 51 includes an averaging element, a sign judgment element, an adder, a multiplier, and a PI controller, wherein the averaging element is connected to the sign judging element through the output terminal of the adder, and is connected in series with the PI controller after passing through the multiplier; the switching signal modulation module 52 includes the carrier comparison and the sorting algorithm. Furthermore, the input of the capacitor voltage balancing module 51 includes the current signal of the current generator 1, the capacitor voltage signals of tested SMs output by the testing module group 2 and the reference voltage signals output of the cascaded converter system parameter model 3. The reference voltage signals include the average capacitor voltage and the SM reference voltage; the capacitor voltage balancing module 51 outputs the target voltage signal of the testing module group 2; the switching signal modulation module 52 adopts the carrier comparison or sorting algorithm. The target voltage signal that is generated by the capacitor voltage balancing module 51 determines the number of tested SMs to be inserted, and controls the switching states of each tested SM in the testing module group 2 according to the current signal of the current generator 1.

In some embodiments of the present invention, the cascaded converter system parameter model 3 is used to emulate the electrical characteristics of the actual system according to the system and operating parameters of the cascaded converter. The current controller 4 and the voltage controller 5 are respectively used for current control calculations and voltage control calculations.

Figure 14:
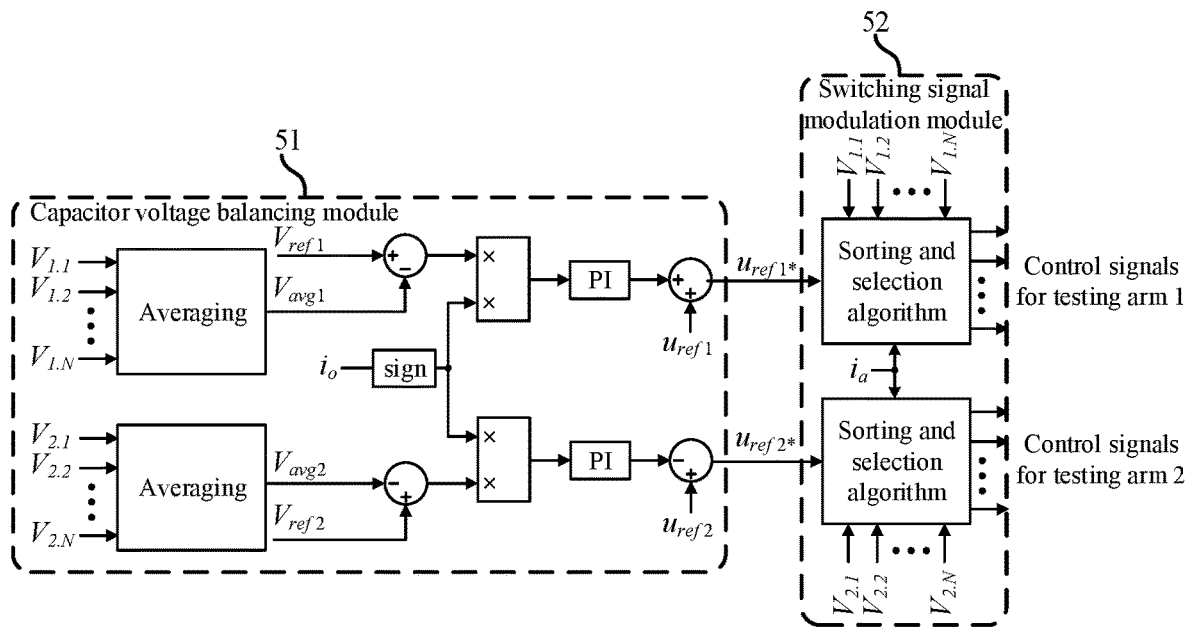
FIG. 14 is a schematic block diagram of the implementation of the voltage controller in the testing system for SMs of the cascaded converter according to an embodiment of the present invention.

FIG. 14 is a schematic block diagram of the implementation of the voltage controller in test system for SMs in the cascaded converter according to an embodiment of the present invention. In this embodiment, the schematic block diagram of the voltage controller 5 includes but is not limited to the structure shown in FIG. 14. The voltage controller 5 is composed of a capacitor voltage balancing module 51 and a switching signal modulation module 52. The capacitor voltage balancing module 51 collects the current signal of the current generator 1, the capacitor voltage signal of each tested SM output by the testing module group 2, and the average capacitor voltage and the SM reference voltage output by the cascaded converter system parameter model 3, and generates the synthesized reference voltage signal (i.e. the target voltage signal) of the testing arm 1 and the testing arm 2 in the testing module group 2.

As a preference, the switching signal modulation module 52 uses a voltage modulation method to determine the pulse signal of each tested SM in the testing module group based on the specific carrier waveform and the target voltage signal generated by the capacitor voltage balancing module, such as CPS modulation; or sorts the capacitor voltages of the tested SMs, and determines the pulse signal of each tested SM in the testing module group in combination with the direction of the testing current, such as the nearest level control modulation. Therefore, the capacitor voltage of the tested SM in the testing module group is approximately the same as the capacitor voltage of the SM that needs to be emulated in the actual cascaded converter.

Specifically, the switching signal modulation module 52 uses an optional carrier comparison or sorting algorithm to determine the inserted number of tested SMs in the testing module group 2 according to the target voltage signal generated by the capacitor voltage balancing module, and controls the switching state of each tested SM in the testing module group 2 according to the current signal output by the current generator 1. The voltage controller 5 performs closed-loop control on the capacitor voltages of the tested SMs in the testing module group 2. In the voltage balancing module 51, the average values $V_{avg1}$ and $V_{avg2}$ of the capacitor voltages of the tested SMs in two testing arms are respectively compared with the reference capacitor voltage signals $V_{ref1}$ and $V_{ref2}$ output by the cascaded converter system parameter model to obtain the capacitor voltage difference, which is multiplied by the polarity of the testing current signal output by the current generator and then superimposed with the reference voltage signals $u_{ref1}$ and $u_{ref2}$ output by the cascaded converter system parameter model after passing through the proportional-integral controller (optional), as the input signals of the switching signal modulation module 52. The output signals of the capacitor voltage balancing module is used to generate pulse signals of the tested SM in two testing arms, so as to make the capacitor voltage of each tested SM in the testing module group 2 approximately the same as that of the target SM in the actual cascaded converter Specifically, the target voltage signals of two testing arms are obtained as follows:

$$\begin{cases} u_{ref1^*} = u_{ref1} + \text{sign}(i_a)\left(K_p + \dfrac{K_i}{s}\right)(V_{ref1} - V_{avg1}) \\ u_{ref2^*} = u_{ref2} - \text{sign}(i_a)\left(K_p + \dfrac{K_i}{s}\right)(V_{ref2} - V_{avg2}) \end{cases}$$

where $K_p$ is the proportional coefficient of the voltage controller, and $K_i$ is the integral coefficient of the voltage controller. The sign function is used for judging the direction of the current signal output by the current generator 1. $u_{ref1^*}$ and $u_{ref2^*}$ represent the target voltage signals of the first and second testing arm, respectively.

In another embodiment of the present invention, a current control method of the testing system for SMs in the cascaded converter in the above-mentioned embodiment is provided, so as to suppress the interference of the pulse voltage of the testing module group caused by the NLC modulation on the current output waveform; specifically, by compensating the feedforward voltage in the current controller, the interference introduced by the pulse voltage of the tested SM with NLC modulation can be eliminated.

As a preferred embodiment, the current control method in the current controller 4 adopts PIR control, and the modulation method of the output voltage adopts sinusoidal pulse width modulation (SPWM).

As a preferred embodiment, after the current controller 4 receives the reference testing current signal, the testing current signal, and the feedforward voltage signal, it outputs a switching sequence to control the current generator 1 so as to generate the required current. Therefore, the testing current in the mission profile emulation system is the same as the arm current in the target actual cascade converter system. The specific working process of the current controller 4 is as follows: the current controller 4 inputs the difference, between the reference current signal and the calculated or sampled feedforward voltage, into the PIR controller, and then compensates the received feedforward voltage in the output terminal of the PIR controller, and finally controls the current generator 1 with the corresponding SPWM switching sequence that is generated from the compensated modulation voltage.

In the embodiment of the present invention, the current control method of mission profile emulation system that is applicable to the NLC modulation counterbalances the interference of the pulse voltage of the testing module group 2 that is caused by the NLC modulation by compensating the feedforward voltage; the feedforward voltage that changes synchronously with the pulse voltage at the terminal of the testing module group is compensated to the output of the PIR regulator in the current controller, so as to eliminate the interference caused by the pulse voltage at the terminal of the tested SM and remove the current distortion caused by the interference of the pulse voltage.

Figure 10:
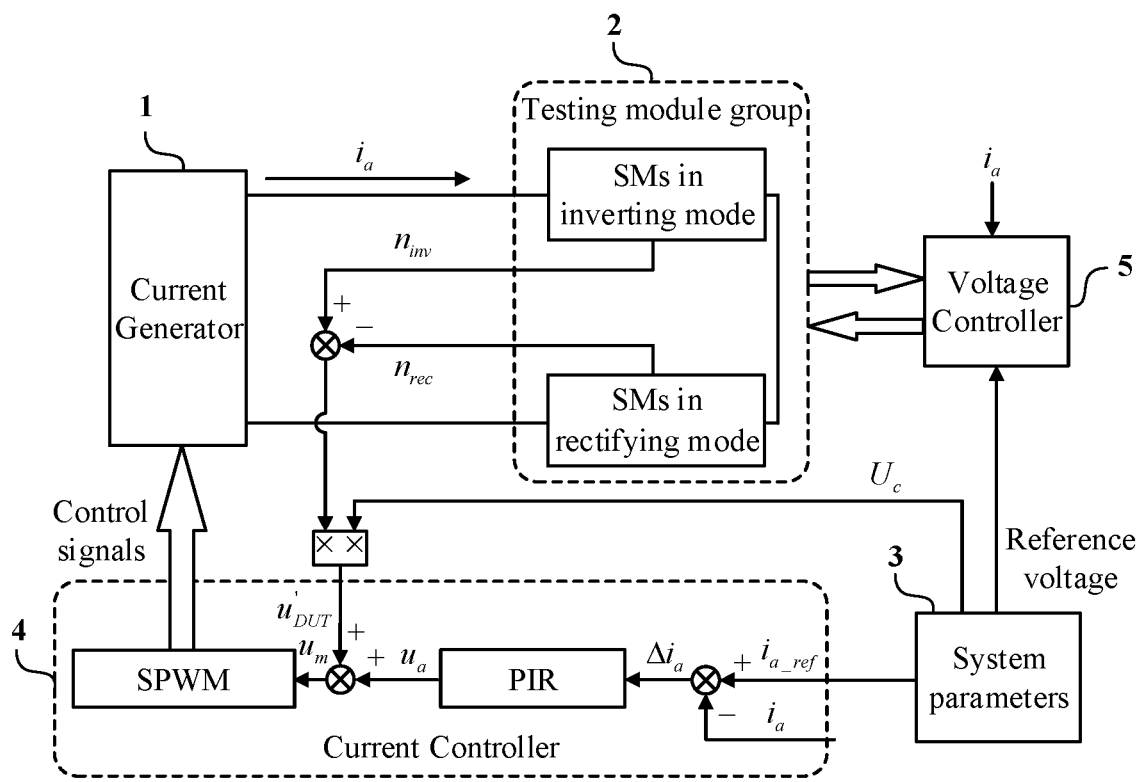
FIG. 10 is a schematic block diagram of the first method of generating the feedforward voltage of the current control method according to an embodiment of the present invention.

FIG. 10 is a schematic block diagram of the first method of generating a feedforward voltage in the current control method given in an embodiment of the present invention. The feedforward voltage used for compensation is generated in either of the following two ways.

Specifically, in one embodiment, the feedforward voltage generation method 1 is adopted, that is, generate the feedforward voltage by calculating the difference between the inserted number of SMs operating in inverting and rectifying modes, in combination of the capacitor voltage of a single SM. The process of feedforward voltage compensation through this method is shown in FIG. 10. The feedforward voltage generation method is specifically: First, record the switching states of all tested SMs in the testing module group 2 in the next control cycle, with the on state recorded as 1 and the off state recorded as 0; After that, calculate the difference between the sum of the switching states of all tested SMs in the inverting mode and the sum of the switching states of all tested SMs in the rectifying mode; Finally, multiply the difference by the capacitor voltage of a single SM to generate the feedforward voltage required for current control in the next control cycle. The generated feedforward voltage is expressed by:

$$u_{DUT}' = U_c \times (n_{inv} - n_{rec})$$

where $u_{DUT}'$ is the feedforward voltage used for compensation, $U_c$ is the DC component of the SM capacitor voltage, $n_{inv}$ is the inserted number of the tested SMs in the inverting mode in the next control cycle, and $n_{rec}$ is the inserted number of the tested SMs in the rectifying mode in the next control cycle;

Optionally, in the first feedforward voltage generation method, the capacitor voltage of a single SM required to generate the feedforward voltage can be obtained from the cascaded converter system parameter model, or from the sampled capacitor voltage of a single SM.

Figure 11:
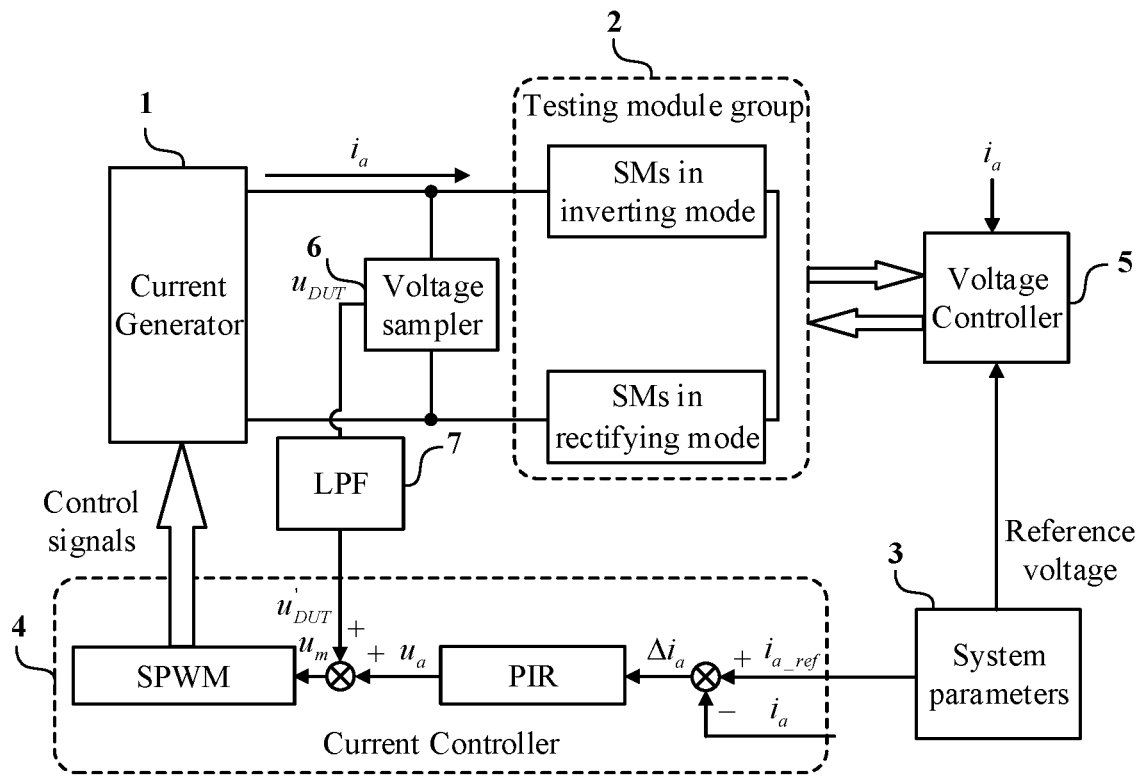
FIG. 11 is a schematic block diagram of the second method of generating the feedforward voltage of the current control method according to an embodiment of the present invention.

In another embodiment, the second feedforward voltage generation method is adopted, as shown in FIG. 11, which is a schematic block diagram of the second feedforward voltage generation method in the current control method in an embodiment of the present invention. This method generates a feedforward voltage based on the sampled terminal voltage signal of the testing module group 2, which will be further filtered by a low-pass filter. The process of performing feedforward voltage compensation by this method is shown in FIG. 11. The feedforward voltage generation method is specifically as follows: first, the terminal voltage sampler 6 samples the terminal pulse voltage signal of the testing module group 2 and the voltage difference signal at both ends of the current generator 1; and then the sampled voltage signal passes through the low-pass filter 7 to filter out the sampling error caused by the switching dead zone; finally, the low-pass filtered voltage signal is used as the feedforward voltage. The feedforward voltage generation method can be expressed:

$$u_{DUT}' = u_{DUT} \times \left(\frac{\omega_0}{s + \omega_0}\right)$$

where $u_{DUT}'$ is the feedforward voltage used for compensation, $u_{DUT}$ the terminal pulse voltage signal obtained by the voltage sampler, $\omega_0$ is the corner frequency of the low-pass filter, and s is the complex variable in the transfer function.

In the second feedforward voltage generation method, the corner frequency of the low-pass filter used for filtering the sampled voltage signal is selected as 1/10 to 1/100 of the frequency of the high-frequency voltage pulse caused by the switching dead zone; the low-pass filter is realized by either an analog circuit or a digital circuit.

When mission profile emulation system for SMs in the cascaded converter adopts the NLC modulation method, the switching dead zone will cause the voltage signal at both ends of the testing module group to be superimposed with high-frequency voltage pulses. The extremely narrow pulse width of this type of high-frequency pulse has little interference to the current controller, but if these high-frequency voltage pulses are sampled and compensated to the current controller, it will cause greater interference to the current controller as the compensated high-frequency pulse voltage and the actual high-frequency pulse are not well synchronized. Therefore, after the terminal voltage of the testing module group is sampled, it passes through the low-pass filter 7, so as to eliminate the high-frequency pulse voltage in the compensation voltage.

Figure 12:
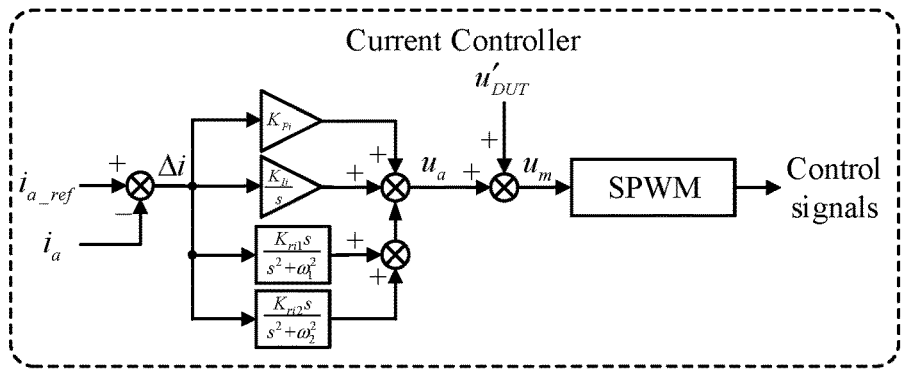
FIG. 12 is a schematic block diagram of the current controller in the testing system for SMs of the cascaded converter according to an embodiment of the present invention.

In the current control method provided by the embodiment of the present invention, the feedforward voltage is compensated in the current controller 4 to cancel the interference of the pulse voltage of the testing module group 2 caused by the NLC modulation. Specifically, the current control method can be expressed as: Compensate the obtained feedforward voltage signal to the output terminal of the PIR regulator in the current controller 4, and then controls the current generator 1 with the corresponding SPWM switching sequence that is generated from the compensated modulation voltage. The control process is shown in FIG. 12, which can be expressed as:

$$\begin{cases} \Delta i_a = i_{a\_ref} - i_a \\ u_a = \Delta i_a \times \left( K_{Pi} + \frac{K_{Ii}}{s} + \frac{K_{ri1}s}{s^2 + \omega_1^2} + \frac{K_{ri2}s}{s^2 + \omega_2^2} \right) \\ u_m = u_a + u'_{DUT} \end{cases}$$

wherein $i_{a\_ref}$ is the reference value of the testing current, $i_a$ is the testing current generated by the current generator, $\Delta i_a$ is the difference between the testing current reference value and the testing current, $u_a$ is the output of the PIR regulator, $u_{DUT}'$ is the feedforward voltage for compensation, $u_a$ is the modulation voltage of the current generator, $\omega_1$ is the first current frequency, $\omega_2$ is the second current frequency, $K_{Pi}$ is the proportional coefficient of the current controller, $K_{Ii}$ is the integral coefficient of the current controller, $K_{ri1}$ and $K_{ri2}$ are the resonant coefficients of the current controller corresponding to the first current frequency and second current frequency, and s is the complex variable in the transfer function.

Figure 13:
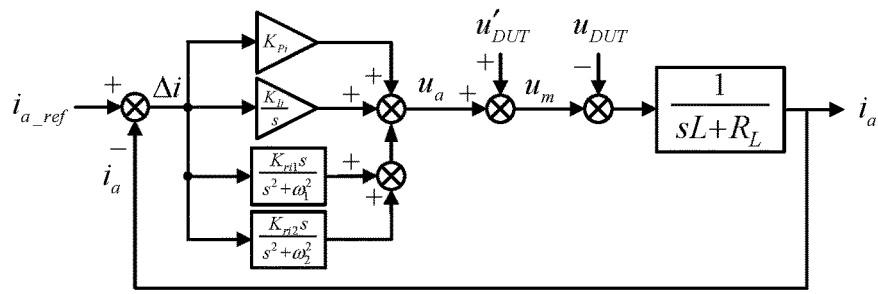
FIG. 13 is a schematic block diagram of the feedforward voltage compensation according to an embodiment of the present invention.

The block diagram of the arm current control loop is shown in FIG. 13. It can be clearly seen that after the impact of the pulse voltage of the testing module group 2 on the current control loop can be cancelled by the compensation voltage, so that the inference of the pulse voltage can be suppressed. Therefore, the arm current output by the testing system can track the reference current stably.

In some embodiments of the present invention, the constructed mission profile emulation system is used for emulating the operating conditions of the SMs in the cascaded converter, so that the electrical characteristics of the testing module group 2 in the mission profile emulation system are almost the same as the SMs in the actual cascaded converter. That is to say, the operating condition of the SMs in the actual cascaded converter can be evaluated by the constructed mission profile emulation system.

In some embodiments of the present invention, the voltage modulation method of the mission profile emulation system for SMs in the cascaded converter can adopt but not limited to the NLC or CPS modulation method. The cascaded converters that can be emulated include but are not limited to half-bridge or full-bridge circuit based modular multilevel converter (MMC) and cascaded H-bridge converter (CHB).

The current control method for the testing system for SMs of the cascaded converter provided by the above embodiments generates the feedforward voltage through calculation or sampling, and compensates the feedforward voltage by using the current controller. As the generated feedforward voltage changes synchronously with the switching states of the tested SM, this method performs better in eliminating the interference of pulse terminal voltage of the testing module group 2 that adopts NLC modulation, and further removes the current distortion caused by the pulse voltage. This method does not rely on additional auxiliary circuits. Thereby it reduces the complexity of control system, saves the manufacturing cost of the testing system, and is a valuable technical improvement.

The specific embodiments of the present invention have been described above. It should be understood that the present invention is not limited to the above specific embodiments, and those technicians in the art can make various changes or modifications within the scope of the claims, which does not affect the essence of the present invention. In the case of no conflict, the embodiments of the present application and the features in the embodiments can be combined with each other arbitrarily.

What is claimed is:

1. A testing circuit for a plurality of SMs of a cascaded converter, comprising:
   a current generator and a testing module group, wherein the current generator provides a testing current to the testing module group; wherein the testing module group adopts any of the following forms:
   the testing module group comprises two testing arms, each of the two testing arms comprises a plurality of tested SMs connected in series, and the two testing arms are in a reverse series connection structure, in which DC voltage components in capacitor voltages of the plurality of tested SMs of said two testing arms are equal in magnitude but opposite in direction; the plurality of tested SMs, in each of the two testing arms, implement both rectifying and inverting operating conditions of the cascaded converter respectively; the two testing arms have identical structures or different structures;
   the testing module group comprises one or more testing units, and the one or more testing units are connected in series; each testing unit comprises two tested SMs connected in series reversely, in which DC voltage components in capacitor voltages of the two tested SMs are equal in magnitude but opposite in direction, wherein the two tested SMs implement both the rectifying and inverting operating conditions of the cascaded converter respectively;
   the testing module group and internal tested SMs of the testing module group are arranged in any order in the testing circuit, wherein an electrical connection relationship remain unchanged; when the testing module group receives the testing current generated by the current generator, the testing module group emulates a voltage signal of the plurality of SMs in the cascaded converter, or emulates the voltage signal and a current signal of the plurality of SMs in the cascaded converter,
   wherein the current generator comprises: a single-phase converter and a filter; wherein:
   when the testing module group comprises the two testing arms with the identical structures, a first end of the single-phase converter is connected to an input end of the filter, and an output end of the filter is connected to an input end of a second testing arm of the two testing arms, a second end of the single-phase converter is connected to an input end of a first testing arm of the two testing arms in series, and output ends of the two testing arms are mutually connected; a series sequence of the single-phase converter, the filter, and the two testing arms are changeable into different configurations;

when the testing module group comprises the one or more testing units, the first end of the single-phase converter is connected to the input end of the filter, and the output end of the filter is connected to a first input end of the one or more testing units in series connection the second end of the single-phase converter is connected to a second input end of the one or more testing units in series connection; the series sequence of the single-phase converter, the filter, and the one or more testing units are changeable into the different configurations.

2. The testing circuit according to claim 1, wherein each tested SM comprises: a bridge circuit and a capacitor, and the bridge circuit and the capacitor are connected in parallel.

3. The testing circuit according to claim 1, wherein the bridge circuit is a half-bridge circuit or a full-bridge circuit; and the filter is an L filter or a CL filter or an LC filter or an LCL filter.

4. The testing circuit according to claim 1, wherein the plurality of tested SMs correspond to the plurality of SMs in an actual cascaded converter, and the testing current regulated by the current generator corresponds to an arm or a phase current flowing through the plurality of tested SMs in the actual cascaded converter; the testing current refers to: an upper arm current and a lower arm current of each phase of the cascaded converter, or an output current of each phase.

5. The testing circuit according to claim 1, when the testing module group comprises the two testing arms with the identical structure, the two testing arms comprises same number of the plurality of tested SMs, and the DC voltage components of the plurality of tested SMs are identical.

6. A testing method suitable for SMs in a cascaded converter under a nearest level control (NLC) modulation, wherein the testing method is based on the testing circuit for the plurality of SMs in the cascaded converter according to claim 1 or a testing system by using a current control method, wherein the testing system comprises the current generator, the testing module group, a cascaded converter system parameter model, a current controller, and a voltage controller; wherein the current generator is used to provide a testing current, with a specific waveform, to the testing module group;

the testing module group comprises a plurality of testing arms, each of the plurality of testing arms comprises a plurality of tested SMs connected in series, and the plurality of testing arms are in a reverse series connection structure, in which DC voltage components in capacitor voltages of the plurality of tested SMs of the plurality of testing arms are equal in magnitude but opposite in direction, or the testing module group comprises one or more tested units, and the each testing unit comprises the two tested SMs in reverse series, and the one or more tested units are in series relationship;

when the testing module group receives the testing current regulated by the current generator, the testing module group outputs voltage signals of the two tested SMs;

the cascaded converter system parameter model is used to output a reference current signal and a reference voltage signal, corresponding to system parameters and operating conditions of an actual cascaded converter, to the current controller and voltage controller;

the current controller is used to control the testing current generated by the current generator and the current controller is used to generate control signals required by the current generator; and the voltage controller is used to control a capacitor voltage of the one or more tested SMs in the testing module group, and to generate switching signals of the one or more tested SMs in the testing module group, wherein the current control method is used to suppress an interference of a pulse voltage of a tested SM caused by a nearest level control (NLC) modulation on a current output waveform; wherein by compensating a feedforward voltage in a current controller, the interference of the pulse voltage of the tested SM caused by the NLC modulation is eliminated; wherein: the feedforward voltage used for compensation is generated by any of the following methods:

a first method: calculating a difference between an inserted number of tested SMs in an inverting mode and the tested SMs in a rectifying mode, and generating the feedforward voltage in combination with a capacitor voltage of a single SM;

a second method: sampling a terminal pulse voltage signal of the tested SM through a voltage sampler; performing a low-pass filtering on the terminal pulse voltage signal to remove a sampling error caused by a switching dead zone; using a filtered voltage signal as the feedforward voltage;

the feedforward voltage changing synchronously with the pulse voltage at a terminal of the tested SM is compensated to an output of a PIR regulator in the current controller to eliminate the interference caused by the pulse voltage at the terminal of the tested SM and remove a current distortion caused by the interference of the pulse voltage.

7. A testing system for SMs of a cascaded converter, comprising:

a current generator, a testing module group, a cascaded converter system parameter model, a current controller, and a voltage controller; wherein the current generator is used to provide a testing current, with a specific waveform, to the testing module group;

the testing module group comprises a plurality of testing arms, each of the plurality of testing arms comprises a plurality of tested SMs connected in series, and the plurality of testing arms are in a reverse series connection structure, in which DC voltage components in capacitor voltages of the plurality of tested SMs of the plurality of testing arms are equal in magnitude but opposite in direction; or the testing module group comprises one or more tested units, and each testing unit comprises two tested SMs in a reverse series connection, in which DC voltage components in capacitor voltages of the two tested SMs are equal in magnitude but opposite in direction, and the one or more tested units are in series relationship;

when the testing module group receives the testing current regulated by the current generator, the testing module group outputs voltage signals of the two tested SMs;

the cascaded converter system parameter model is used to output a reference current signal and a reference voltage signal, corresponding to system parameters and operating conditions of an actual cascaded converter, to the current controller and voltage controller;

the current controller is used to control the testing current generated by the current generator and the current controller is used to generate control signals required by the current generator; and the voltage controller is used to control a capacitor voltage of the plurality of tested SMs in the testing module group, and to generate switching signals of the plurality of tested SMs in the testing module group, wherein the voltage controller, based on capacitor voltage signals of the plurality of tested SMs output by the testing module group and the reference voltage signal output by the cascaded converter system parameter model, generates control signals of switching devices in each tested SM, wherein the capacitor voltage of the each tested SM within the testing module group remains balanced, and the capacitor voltage of the each tested SM is identical to a capacitor voltage of a targeted SM in the actual cascaded converter, wherein the voltage controller comprises: a capacitor voltage balancing module and a switching signal modulation module; wherein:

the capacitor voltage balancing module generates target voltage signals of the plurality of tested SMs based on the testing current output by the current generator, the capacitor voltage of the each tested SM inside the testing module group, and the reference voltage signal output by the cascaded converter system parameter model; wherein the reference voltage signal comprises an average capacitor voltage and a reference voltage of SM;

the switching signal modulation module determines a number of tested SMs to be inserted according to a target voltage signal generated by the capacitor voltage balancing module, and the switching signal modulation module determines a switching status of the each tested SM according to the testing current output by the current generator.

8. The testing system according to claim 7, wherein the current controller realizes one or two of the following controls:

according to a test current signal and the reference current signal output by the cascaded converter system parameter model, a control signal of the current generator is generated, and the testing current output by the current generator is adjusted by the control signal, and the testing current output by the current generator is identical to the reference current signal output by the cascaded converter system parameter model;

the current controller is configured to collect an output testing current $i_a$ of a single-phase current generator and a reference current $i_{a,ref}$ output by the cascaded converter system parameter model, calculate a current difference between the output test current $i_a$ and the reference current $i_{a,ref}$, and transfer the current difference to a proportional-integral-resonant controller to generate a reference output voltage $u_a$ of the current generator, wherein the reference output voltage $u_a$ of the current generator is used to generate control signals of semiconductors in the current generator with a pulse-width modulation.

9. The testing system according to claim 7, wherein the capacitor voltage balancing module comprises an averaging element, a sign judgment element, an adder, a multiplier, and a PI controller, wherein the averaging element is connected to the sign judgment element through an output terminal of the adder, and the averaging element is connected in series with the PI controller after passing through the multiplier;

the capacitor voltage balancing module performs a closed-loop control strategy on the capacitor voltages of the plurality of tested SMs in the testing module group, and the closed-loop control strategy is as follows:

average values $V_{avg1}$ and $V_{avg2}$ of the capacitor voltages of the plurality of tested SMs in a testing arm of the plurality of testing arms are respectively compared with reference capacitor voltage signals $V_{ref1}$ and $V_{ref2}$ output by the cascaded converter system parameter model to obtain a capacitor voltage difference;

the capacitor voltage difference is multiplied by a polarity of a testing current signal output by the current generator, and then superimposed with voltage reference signals $u_{ref1}$ and $u_{ref2}$ output by the cascaded converter system parameter model after passing through the PI controller, as an input signal of the switching signal modulation module; an output signal of the capacitor voltage balancing module determines a number of inserted SMs in a next switching cycle;

the switching signal modulation module adopts a voltage modulation method to determine a gating signal of the each tested SM in the testing module group based on a preset carrier waveform and the target voltage signal generated by the capacitor voltage balancing module, or determine the gating signal of the each tested SM according to a sorting sequence of the capacitor voltages and the direction of the testing current signal, wherein the capacitor voltages of the plurality of tested SMs in the testing module group are identical to capacitor voltages of tested SMs in the actual cascaded converter.

10. The testing system according to claim 7, wherein the reference current signal and reference voltage signal generated by the cascaded converter system parameter model are generated in any of the following ways:

a first method: simulation data obtained from a simulation system with same system parameters and operating conditions as the actual cascaded converter;

a second method: actual data recorded during an operation of the actual cascaded converter;

a third method: equivalent data calculated according to the system parameters and the operating conditions of the actual cascaded converter.

11. A current control method for a cascaded converter SM testing system, wherein the current control method is used to suppress an interference of a pulse voltage output of a tested SM caused by a nearest level control (NLC) modulation on a current output waveform; wherein by compensating a feedforward voltage in a current controller, the interference of the pulse voltage of the tested SM caused by the NLC modulation is eliminated; wherein: the feedforward voltage used for compensation is generated by any of the following methods:

a first method: calculating a difference between an inserted number of tested SMs in an inverting mode and the tested SMs in a rectifying mode, and generating the feedforward voltage in combination with a capacitor voltage of a single SM;

a second method: sampling a terminal pulse voltage signal of the tested SM through a voltage sampler; performing a low-pass filtering on the sampled voltage signal to remove a sampling error caused by a switching dead zone; using a filtered voltage signal as the feedforward voltage;

the feedforward voltage changing synchronously with the pulse voltage at a terminal of the tested SM is compensated to an output of a proportional integral and resonant (PIR) regulator in the current controller to eliminate the interference caused by the pulse voltage at the terminal of the tested SM and remove a current distortion caused by the interference of the pulse voltage.

12. The current control method according to claim 11, wherein the current control method realizes a current control of the cascaded converter SM testing system under the NLC modulation; or the current control method is applied to realize the current control of the cascaded converter SM testing system under a carrier phase shifted (CPS) modulation.

13. The current control method according to claim 11, wherein a process of generating the feedforward voltage by the first method comprises:
   recording switching states of the tested SMs in a testing module group in a next control cycle, with an on state recorded as 1 and an off state recorded as 0;
   calculating a difference between a sum of the switching states of the tested SMs in the inverting mode and a sum of the switching states of the tested SMs in the rectifying mode;
   multiplying the difference by the capacitor voltage of the single SM to generate the feedforward voltage required for a current control in the next control cycle.

14. The current control method according to claim 13, wherein the feedforward voltage of the first method is expressed by:

$$u_{DUT}' = U_c \times (n_{inv} - n_{rec}),$$

wherein $u_{DUT}'$ is the feedforward voltage used for compensation, $U_c$ is a DC component of an SM capacitor voltage, $n_{inv}$ is the inserted number of the tested SMs in the inverting mode in the next control cycle, and $n_{rec}$ is the inserted number of the tested SMs in the rectifying mode in the next control cycle;

the feedforward voltage in the second method is expressed by:

$$u_{DUT}' = u_{DUT} \times \left(\frac{\omega_0}{s + \omega_0}\right),$$

wherein $u_{DUT}'$ is the feedforward voltage used for compensation, $u_{DUT}$ the terminal pulse voltage signal obtained by the voltage sampler, $\omega_0$ is a corner frequency of the low-pass filtering, and s is a complex variable in a transfer function.

15. The current control method according to claim 14, wherein in the first method, the capacitor voltage of the single SM required to generate the feedforward voltage is obtained from the cascaded converter system parameter model, or from a sampled capacitor voltage of the single SM.

16. The current control method according to claim 11, wherein in the second method, a corner frequency of the low-pass filtering used for filtering the voltage signal is selected as $\frac{1}{10}$ to $\frac{1}{100}$ of a frequency of a high-frequency voltage pulse caused by the switching dead zone; the low-pass filter is realized by an analog circuit or a digital circuit.

17. The current control method according to claim 11, wherein a method of eliminating the interference of the pulse voltage of the tested SM by compensating the feedforward voltage in the current controller comprises the following control procedures:

$$\begin{cases} \Delta i_a = i_{a\_ref} - i_a \\ u_a = \Delta i_a \times \left(K_{Pi} + \frac{K_{Ii}}{s} + \frac{K_{ri1}s}{s^2 + \omega_1^2} + \frac{K_{ri2}s}{s^2 + \omega_2^2}\right), \\ u_m = u_a + u_{DUT}' \end{cases}$$

wherein $i_{a\_ref}$ is a reference value of the testing current, $i_a$ is the testing current generated by the current generator, $\Delta i_a$ is a difference between a testing current reference value and the testing current, $u_a$ is the output of the PIR regulator, $u_{DUT}'$ is the feedforward voltage for compensation, $u_m$ is a modulation voltage of the current generator, $\omega_1$ is a first current frequency, $\omega_2$ is a second current frequency, $K_{Pi}$ is a proportional coefficient of the current controller, $K_{Ii}$ is an integral coefficient of the current controller, $K_{ri1}$ and $K_{ri2}$ are resonant coefficients of the current controller corresponding to the first current frequency and second current frequency, and s is a complex variable in a transfer function.

* * * * *